United States Patent [19]

Pao et al.

[11] 4,344,081
[45] Aug. 10, 1982

[54] COMBINED DMOS AND A VERTICAL BIPOLAR TRANSISTOR DEVICE AND FABRICATION METHOD THEREFOR

[75] Inventors: Henry C. Pao; Richard A. Blanchard, both of Los Altos; Benedict C. K. Choy, Campbell, all of Calif.

[73] Assignee: Supertex, Inc., Sunnyvale, Calif.

[21] Appl. No.: 139,793

[22] Filed: Apr. 14, 1980

[51] Int. Cl.³ .............................................. H01L 27/02
[52] U.S. Cl. ...................................... 357/43; 357/23; 357/35; 357/41
[58] Field of Search ......................... 357/43, 23, 35, 41

[56] References Cited
U.S. PATENT DOCUMENTS
4,199,774 5/1980 Plummer ............................... 357/41

Primary Examiner—Martin H. Edlow
Attorney, Agent, or Firm—Harry M. Weiss

[57] ABSTRACT

This disclosure relates to an improved DMOS semiconductor type device which can function both as a DMOS (unipolar) type device and as a bipolar transistor device. The DMOS device has two separated source regions of, for example, N+ conductivity and each of these source regions is surrounded by a P− type region, thus providing a pair of channels between each N+ source region and a common N type drain region located between the P− regions. A gate electrode is disposed over both of the channels and functions to permit electrons from the N+ source regions to flow across the P− channels into the common N type drain region when a proper bias is applied to the gate region. Each of the source regions has its own electrode and a separate electrode is provided to each of the P− regions that surround each of the respective N+ source regions. Thus, the DMOS type structure can function as a DMOS device with the electrodes to the source regions serving as source electrodes and the gate electrode functioning to permit electron flow from the separated source regions to a common drain region. Alternatively, one of the electrodes to the N+ source region could function as an emitter (or a source electrode for MOS operation) electrode with the electrode to the surrounding P− region serving as a base electrode. To complete the bipolar vertical transistor, a collector electrode is provided electrically coupled to the N− region. Alternatively, the collector electrode serves as the drain electrode if the device is operated as a DMOS device.

4 Claims, 13 Drawing Figures

COMBINED DMOS AND A VERTICAL BIPOLAR TRANSISTOR DEVICE AND FABRICATION METHOD THEREFOR

BACKGROUND OF THE INVENTION

1. Field of the Invention

This invention relates generally to DMOS type semiconductor devices and fabrication methods therefor and, more particularly, to DMOS semiconductor devices that can operate in a different mode and the fabrication methods thereof.

2. Description of the Prior Art

In the past, DMOS type semiconductor structures have been fabricated by the semiconductor industry generally for the purpose of providing high powered MOS or unipolar type devices. These DMOS (double diffused MOS) type devices took on various shapes and configurations.

More recently, a DMOS configuration that became of significant commercial importance is a structure that utilized, for example, a common drain region and a pair of spaced separate source regions each of which was located in a substantially surrounding separate region located within the common drain region with the surrounding separate region being of opposite type conductivity to either the source regions or the drain region. A gate electrode was used to either turn the device on or off depending upon the bias or potential that was applied to the gate electrode. The gate electrode functioned to permit conduction of holes (for P channel type devices) or electrons (for N channel type devices) across the two channels provided by the separated source regions located within the substantially surrounding separate regions of opposite type conductivity.

Alternatively, if desired, the DMOS structure could operate with two drain regions separated from each other and each located within a region of opposite type conductivity thereby providing separate drain regions and a common source region. In this embodiment, which would be like the previously described DMOS device with multiple source regions and a common drain, the difference would be the reversal of use of the source and drain regions.

In any of the above embodiments the surrounding region of opposite conductivity that substantially surrounded the separate source or separate drain region was electrically tied to the separate source or separate drain region. This was normally achieved by the use of a metal ohmic contact material (i.e. aluminum) that was located as an electrical contact across the P N junction separating the separate source or drain region from the surrounding region of opposite type conductivity. Thus, this type of electrical contact served to electrically connect together the separate source or drain regions to the surrounding region of opposite type conductivity.

One problem with the DMOS structure that was previously used was that the DMOS structure had a higher "on" resistance during use than conventional bipolar transistor devices. Another problem is that the operating (I,V) slope provided by the DMOS prior art structure was not a smooth, stable curve when plotting the voltage versus current characteristic operation curve for this type of device, but displayed or provided what is known as a "latchback" type of curve which means that the (I,V) curve for this device did not provide a smooth increasing current for a specific device operating voltage (which was to be substantially linearly increasing in current for a given operating voltage). The "latchback" type of curve that was produced due to the use of the prior art DMOS structure exhibited a decrease in the operating voltage from an initial voltage value thereby causing the curve to take on a "hump" shape configuration designated as a "latchback" curve.

Accordingly, a need existed to provide a DMOS type device that would eliminate the undesired "latchback" characteristics of previous DMOS devices and would have favorable operating characteristics such as a lower "on" resistance when operational.

SUMMARY OF THE INVENTION

It is an object of this invention to provide an improved semiconductor device and fabrication method therefor.

It is a further object of this invention to provide an improved DMOS type of semiconductor device and fabrication method therefor.

It is another object of this invention to provide an improved DMOS type of semiconductor device that can also operate as a bipolar transistor device and a fabrication method therefor.

It is still another object of this invention to provide an improved combined DMOS transistor and bipolar transistor device that can be selectively operated as either a MOS or bipolar device for improved electrical device characteristics and a fabrication method therefor.

DESCRIPTION OF THE PREFERRED EMBODIMENTS

In accordance with one embodiment of this invention, there is provided a combined DMOS-Bipolar transistor semiconductor device comprising, in combination, an integrated DMOS transistor structure having source and drain regions defining plural channels and a gate electrode located over said plural channels, a vertical bipolar transistor structure having emitter, base and collector regions, said emitter and collector regions of said vertical bipolar transistor structure being said source and drain regions of said DMOS transistor structure, and electrical contact means for providing electrical contacts to said regions to permit operation of said device as a DMOS device and as a Bipolar transistor device.

In accordance with another embodiment of this invention, there is provided a method for fabricating a DMOS-Bipolar transistor semiconductor device comprising the steps of forming both an integrated DMOS transistor structure in a semiconductor substrate having source and drain regions defining plural channels with a gate electrode located over said plural channels, and a vertical bipolar transistor structure having emitter, base and collector regions with said emitter and collector regions of said vertical bipolar transistor structure being the source and drain regions of said DMOS transistor structure, and providing electrical contacts to said regions for permitting operation of said device as a DMOS device and as a Bipolar transistor device.

In accordance with still another embodiment of this invention, there is provided a method for providing an improved transistor device operation comprising the steps of providing both an integrated DMOS transistor structure in a semiconductor substrate having source and drain regions defining plural channels with a gate electrode located over said plural channels and a vertical bipolar transistor structure having emitter, base and collector regions with said emitter and collector regions of said vertical bipolar transistor structure being the source and drain regions of said DMOS transistor structure, turning on said improved transistor device by first operating said integrated DMOS transistor structure as a DMOS device before operating said vertical bipolar transistor structure as a bipolar device, and turning off said improved transistor device by first turning off the bipolar device operation before turning off the DMOS device operation.

The above and other objects, features, and advantages of the present invention will be more clearly understood from the following detailed description taken in conjunction with the accompanying drawings, in which:

DESCRIPTION OF THE SPECIFICATION

Figure 1:
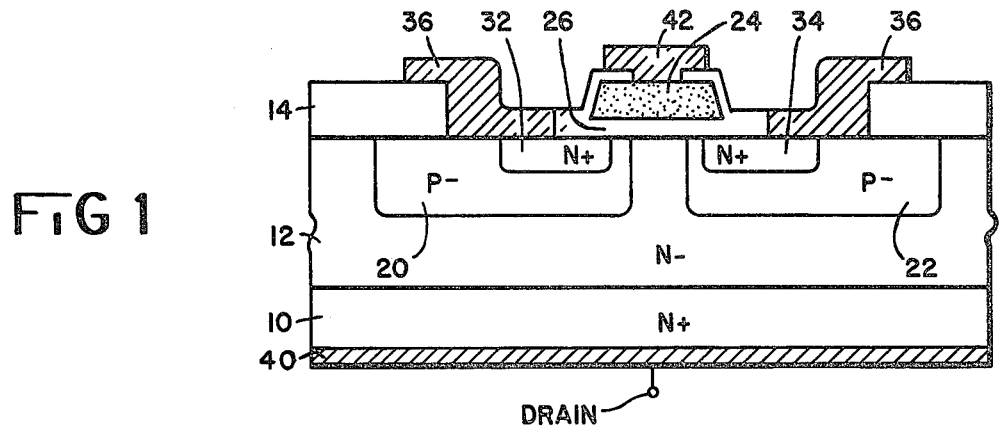
FIG. 1 illustrates in cross section an elevational view showing a prior type of DMOS semiconductor device.

FIG. 1 discloses a prior type of DMOS semiconductor device. Referring to FIG. 1, an N+ region 10 is located at the bottom of the prior DMOS structure of FIG. 1 and functions as a common drain region. Located on the N+ common drain region 10 is an N− region 12 which is also part of the common drain region. An insulating layer 14 is located on the surface of the DMOS device structure of FIG. 1. A pair of P− separated regions 20 and 22 are located within the N− common drain region 12. A gate electrode 24, preferably of doped polysilicon, is spaced from the semiconductor substrate surface by a thin insulating layer 26. The gate electrode 24 serves to simultaneously bias a pair of channels formed between separate N+ source regions 32 and 34, respectively located within P− regions 20 and 22. Metal contacts 36 serve to electrically short out and thereby electrically tie together each separate N+ source region to the surrounding P− region. A drain electrode or contact 40 is provided to the back side of the N+ region 10 and a gate electrode contact 42 is provided to the gate electrode 24 through an opening in an insulating layer substantially enclosing the gate electrode 24. Thus, in operation, the drain electrode 40 serves as a common drain electrode and the gate electrode contact 42 functions to provide a suitable bias or potential to the gate electrode which can be of metal or is preferably a doped polysilicon gate electrode 24 thereby permitting electron flow from the separate N+ source region 32 and 34 across the two channels formed by the surrounding P− regions 20 and 22.

Figure 2:
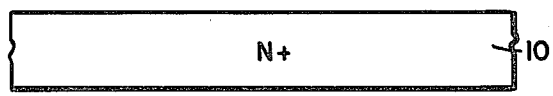

FIG. 2 is the first Figure of a series of Figures describing the method of fabricating the semiconductor device of this invention. FIG. 2 discloses a starting substrate which in the embodiment shown is preferably a substrate of N+ silicon semiconductor material. It should be recognized that opposite type conductivities can be utilized than the conductivity types that are shown in the Figures of this patent specification in order to produce a DMOS device that will be a P channel type device rather than an N channel type device of the type that is shown in the Figures. The starting N+ silicon semiconductor substrate of FIG. 1 is generally designated by reference numeral 10. It should also be understood that other semiconductor materials besides silicon can be utilized, if desired, to fabricate the DMOS semiconductor device that is disclosed herein. For example, Gallium Arsenide can be used as one type of semiconductor material. Germanium is another semiconductor material that can be utilized in place of the silicon semiconductor material that is the preferred embodiment of this disclosure.

Figure 3:
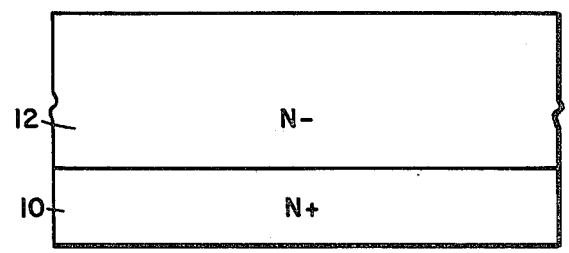

Referring to FIG. 3, an epitaxial layer 12 of N− type conductivity is grown on the starting N+ semiconductor substrate 10. If desired, the starting substrate can be of N− type conductivity and the N+ layer or region can be either epitaxially grown on or diffused into the starting N-substrate to fabricate the structure shown in FIG. 3. The N+ region 10 can also be formed by ion implantation techniques into the backside of an N− starting semiconductor substrate.

Figure 4:
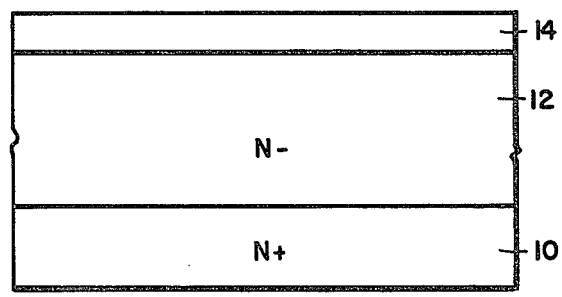

Referring to FIG. 4, an insulating layer 14 preferably made of silicon dioxide is, for example, grown by thermal oxide growth techniques on the top surface of the N− epitaxial layer 12. The silicon dioxide layer 14 can also be deposited such as by pyrolytic techniques.

Figure 5:
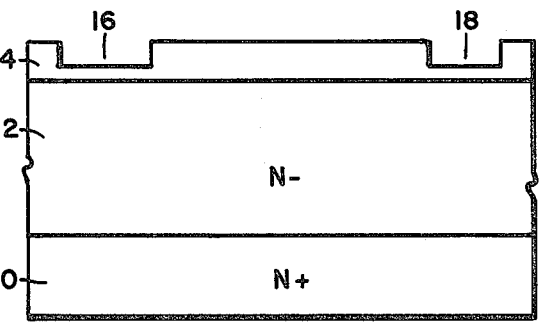

Referring to FIG. 5, a pair of thin regions 16 and 18 are fabricated in the insulating silicon dioxide layer 14. This pair of thin regions 16 and 18 in the insulating layer 14 is preferably fabricated or formed, for example, by the use of photolithographic masking and etching techniques.

Figure 6:
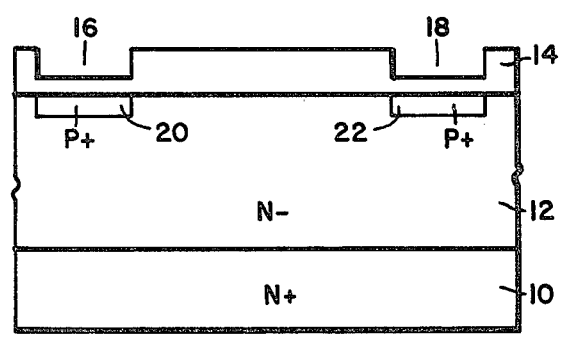

Referring to FIG. 6, the purpose for creating the thin insulating regions 16 and 18 is in order to carry out an ion implantation operation through these thin insulating regions to produce a pair of P+ regions 20 and 22, respectively beneath the thin etched insulator regions 16 and 18. The thicker insulator layer portions function as a mask and prevent the P type ions from being injected into the semiconductor substrate region 10 beneath the thicker oxide regions and only the separated ion implanted regions 20 and 22 formed of P+ type conductivity are located within the substrate portion 10, due to the thinness of the two insulation layer portions 16 and 18 that were formed in the previous processing operation.

Figure 7:
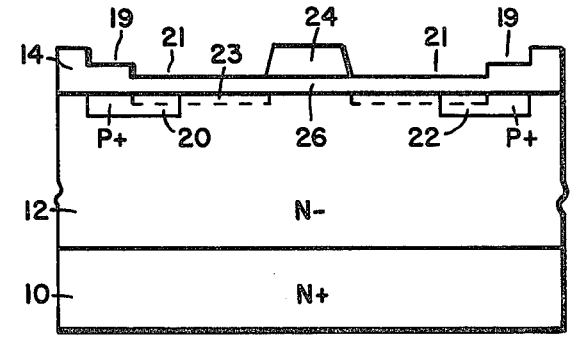

Referring to FIG. 7, a series of process steps are carried out on the semiconductor structure of FIG. 6. Preferably, the first process step is the formation of a thin gate type insulating layer which extends across a portion of the top insulating surface portion or layer on the semiconductor structure and bounded by the two P+ regions 20 and 22 that are located beneath the insulating layer 14. Thus, in looking at FIG. 7, the first step down of the insulating layer 14 from either side when going towards the middle portion of the semiconductor structure is generally designated by reference numeral 19 and designates the etching step that was initially used to form the etched, thin regions 16 and 18 of FIG. 5. The second step down of the insulating layer 14 (again viewed from either side when going towards the middle portion of the semiconductor structure) is generally designated by reference numeral 21 and depicts the etching operation that is used to form the thin gate insulating or oxide layer across the surface of the semiconductor structure of FIG. 7. Thus, as shown, the thin gate oxide layer that is thus formed using photolithographic masking and etching techniques is thinner than the initial etched down regions that were formed in FIG. 5 and generally designated by reference numerals 16 and 18. For example, the thin gate insulating layer can be 1000 A° in thickness, or even thinner, if desired.

Following the formation of the thin gate oxide layer which is preferably a silicon dioxide layer, but could be a composite $SiO_2$ and silicon nitride layer, a polysilicon layer is then deposited on the insulating layer 14 and, following a photolithographic masking and etching operation, a polysilicon region 24 is formed as shown in FIG. 7 (substantially centrally located between the spaced apart P+ regions 20 and 22) on a thin gate oxide layer portion 26.

Subsequently, a P type ion implantation operation is carried out using, for example, Boron ions to provide the shallow type ion implanted region 23 in the N− region 12 on opposite sides of the polysilicon gate electrode 24. As shown in FIG. 7, the ion implanted P type regions 23 extend beneath the thin gate oxide insulating layer portion 26 that goes from the edge between the first etched down regions 19 and the second etched down regions 21 except for the portion of the semiconductor substrate located beneath the oxide insulated polysilicon gate electrode 24. Therefore, the polysilicon gate electrode 24 functions as a mask during this P type ion implantation operation.

Figure 8:
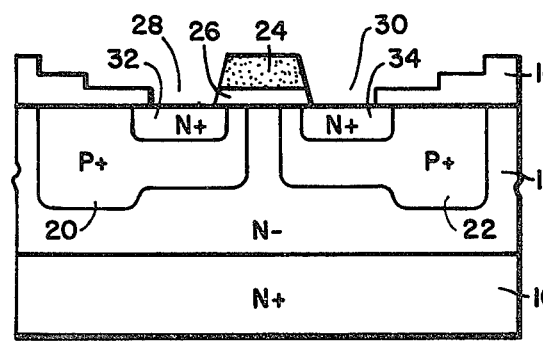

Referring to FIG. 8, openings 28 and 30 are formed (by photolithographic masking and etching techniques) in the thin gate type insulating layer on opposite sides of the polysilicon region 24 that is located on the thin gate oxide layer 26 in order to form self-aligned N+ source type regions 32 and 34, respectively beneath openings 28 and 30. The source type regions 32 and 34 are preferably formed by a diffusion operation, but, if desired, can also be formed by ion implantation techniques either through a thin oxide layer or through bare silicon. The N+ source regions 32 and 34 are formed with impurities of N type conductivity such as Phosphorus or Arsenic. The curved profile depicted in FIG. 8 for the bottom portion of the P+ regions 20 and 22 is created during the drive in diffusion operation that is carried out in forming the P+ regions 20 and 22 with the shallower portion being created from the initially shallow P type regions 23. During the formation of the N+ separate source regions 32 and 34, the gate electrode 24 becomes doped with impurities and thereby becomes electrically conductive to function as a conductive gate electrode. This gate doping can be done separately for specific conductivity control.

Figure 9:
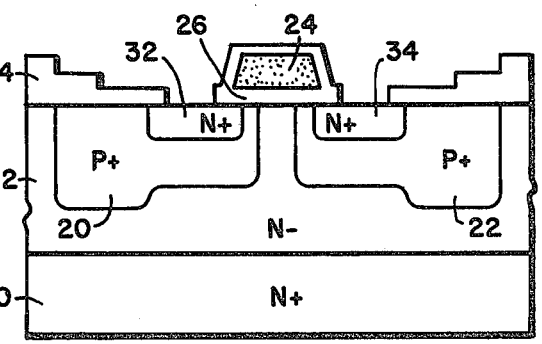

Referring to FIG. 9, an insulating layer (preferably a silicon dioxide layer) is deposited or grown over the top surface portion of the semiconductor structure which causes the gate electrode 24 to become encapsulated with a dielectric material. Subsequently, by use of photolithographic masking and etching techniques, a pair of openings are formed over the spaced N+ source regions 32 and 34 as shown in FIG. 9.

Figure 10:
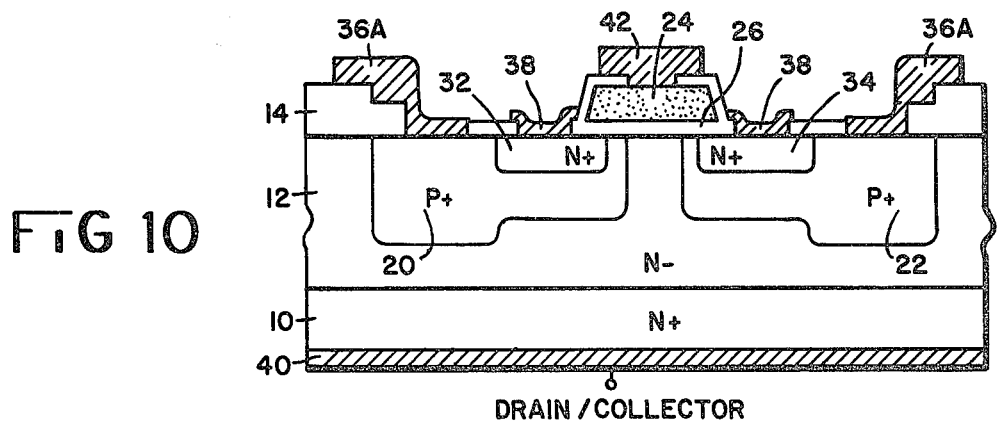
FIGS. 2 through 10B show in cross section elevational views the various steps in the fabrication of the combined DMOS and vertical bipolar transistor device of this invention with FIG. 10 showing one completed embodiment and FIGS. 10A and 10B showing other completed embodiments.

Referring to FIG. 10, similar etched-out openings are formed by photolithographic masking and etching techniques over the P− regions 20 and 22 which can be done in one step (all done in FIG. 9) or in two steps, as desired. It should be noted that the P type regions 20 and 22 started out as heavy P+ regions and remain P+ regions (as shown in FIGS. 8, 9, 10, and 10A) after all the heat treatment processing steps including drive-in diffusion operations. After the openings have been formed through the insulating layer portions over the spaced N+ regions 32 and 34 and over the spaced P+ regions 20 and 22 and after an opening has been formed in the insulating layer portion located over the doped polysilicon gate electrode 24, metal (such as aluminum) is deposited on the top surface as a thin layer and etched (using photolithographic masking and etching techniques) to provide separate electrical contacts 36A to the P+ regions 20 and 22, separate spaced electrical contacts 38 to the separate spaced N+ regions 32 and 34, and an electrical contact 42 to the doped polysilicon gate electrode 24. A thin metal ohmic contact metal such as aluminum, gold, or chrome-silver is deposited on the backside of the semiconductor structure thereby providing an ohmic contact to the N+ drain region 10. The use of the separate N+ regions 32 and 34, the separate P+ regions 20 and 22, and the N type regions 12 and 10 as an N− channel DMOS device or as an NPN bipolar transistor device is described below.

Figure 10A:
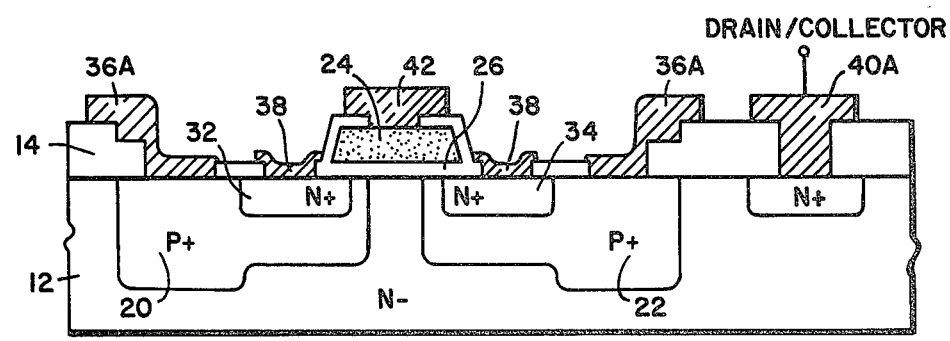

Referring to FIG. 10A, this is an alternative embodiment of the semiconductor structure of FIG. 10 which does not utilize the N+ region 10 located at the bottom of the semiconductor structure, but instead utilizes an electrical metal ohmic contact 40A to an underlying N+ region within the N− region 12 (which is the substrate). The N+ region underlying the metal contact 40A is preferably formed at the same time as the separate N+ source regions 32 and 34 in order to provide a good low resistance electrical contact to the N− region 12. The DMOS device structure of FIG. 10A functions in the same manner as the DMOS device structure of FIG. 10 and can operate in either a DMOS mode of operation or as a vertical bipolar transistor device, as desired.

Figure 10B:
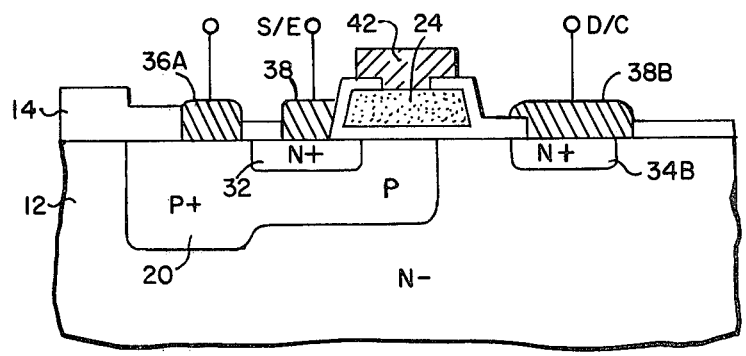

Referring to FIG. 10B, a combined (N channel) DMOS and lateral NPN integrated structure is shown. Similar reference numbers are used in FIG. 10B as were used in FIG. 10A to designate the same regions with the exception of an N+ drain/collector region 34B and an electrical contact 38B connected to the N+ drain/collector region 34B and the N− substrate region 12. Thus, a lateral NPN transistor device structure is provided by N+ emitter region 32, the P type base region 20, and the N+ collector region 34B. Preferably, the base region 20 comprises a deep P+ (low resistance) region beneath the contact 36A and a shallower P region that extends to the surface in contact with the gate oxide portion located beneath the doped polysilicon gate 24. The (N channel) DMOS device structure is provided by N+ source region 32, P type channel portion 20 (beneath the spaced doped polysilicon gate 24) and the N+ drain region 34B.

Figure 11:
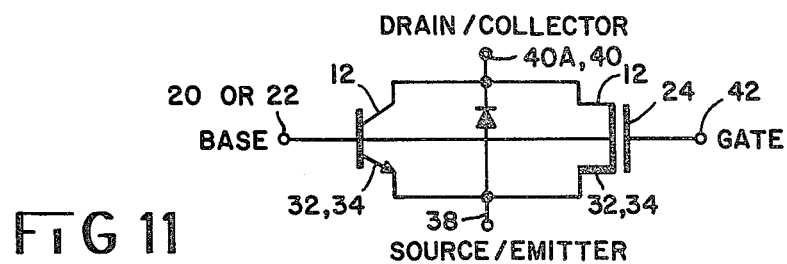
FIG. 11 shows the electrical schematic representation of either the FIG. 10 or 10A embodiments.

Referring to FIG. 11, the semiconductor device structure of FIG. 10 or the semiconductor device structure of FIG. 10A is shown in electrical schematic form in FIG. 11 as a combined bipolar and MOS device operating as a dual mode device (which avoids a saturated bipolar device to provide fast switching). The reference numerals used in the electrical schematic diagram of FIG. 11 designate the corresponding reference numerals used in the semiconductor device structures of FIGS. 10 and 10A. Accordingly, with reference to FIG. 10, the drain electrode 40 serves as both a drain electrode to the N type common drain regions 12 and 10 of the DMOS structure shown in FIG. 10 or as a collector electrode for the vertical NPN transistor device that is provided by the use of electrode 38 that functions as an emitter electrode to either the N+ (emitter) region 32 or the N+ (emitter) region 34 depending on which side of the DMOS structure of FIG. 10 is used as a vertical NPN transistor structure. Thus, the electrode 36A functions as a base electrode to either the P+ (base) region 20 or the P+ (base) region 22 depending upon which region is selected to operate as a base region. A diode is formed between the contact 40A, 40, and the contact 38. If desired, the semiconductor device structure is operated as a combined dual vertical NPN transistor structure with separate N+ emitter regions 32 and 34, separate P+ base regions 20 and 22, and a common collector (N− region 12 and N+ region 10). In operation as a vertical NPN transistor device structure, the N+ region 10 functions as a high conductivity sub-collector region.

Similarly, with regerence to FIG. 10A, the drain or collector electrode 40A functions as either a drain electrode to the N− common drain region 12 (in the DMOS operation embodiment) or as a collector electrode (for the vertical NPN transistor operation embodiment) that is provided by either the N+ emitter region 32, the P+ base region 20, and the N− collector region 12, or by the N+ emitter region 34, the P+ base region 32, and the N− collector region 12.

COMBINED DMOS AND BIPOLAR OPERATION

One very significant advantage of the combined DMOS and bipolar transistor structure of either FIG. 10 or 10A is that this combined DMOS and vertical bipolar device utilizes the space of a single DMOS structure and thereby permits both bipolar and unipolar device operation. Thus, in order to avoid the undesired "latchback" effect described above during device operation, the P+ regions 20 and 22 provide a diode (as shown in FIG. 11) to prevent "latchback." The combined DMOS and vertical bipolar device of this invention provides a high input impedance and very fast switching device by incorporating the advantages of both the bipolar and FET devices. In turning off the combined structure, the bipolar device operation is switched off first followed by turning off the DMOS device operation. The above described method of operation is preferred because it is hard to accomplish fast switching of a bipolar transistor due to secondary breakdown; however, after the bipolar transistor device is switched on, it has a much lower "on" resistance than a unipolar MOS device. Thus, this combined device structure takes advantage of the best operating characteristics of both devices in a single combined structure.

The above description is given by way of example only. Changes in form and details may be made by one skilled in the art without departing from the scope of the invention as defined by the appended claims. For example, multiple epitaxial layers can be used, if desired, to form the device structure, and this would reduce internal resistance. It should also be noted that the different N or P type regions can be formed by either thermal diffusion or ion implantation techniques, as desired. Furthermore, while a DMOS structure is shown as a preferred embodiment, both VMOS and UMOS type structures can be utilized in place of the DMOS structure. Thus, the term SMOS as used in the claims is intended to cover either DMOS, VMOS, or UMOS type devices as used in combination with a bipolar transistor device in one integrated structure.

What is claimed is:

1. A combined MOS-bipolar semiconductor device comprising, in combination,
    a semiconductor body having at least one major surface including a surface portion of one conductivity type;
    first and second spaced regions of opposite conductivity type formed in said body and abutting said major surface, third and fourth regions of said one conductivity type formed in said first and second regions, respectively, abutting said major surface and defining at least one channel region and at least one bipolar transistor;
    an insulating layer on said major surface;
    gate electrode means formed on said insulating layer over said channel region for forming an MOS transistor,
    separate electrical contact means to said first region, said third region, and said gate electrode means for permitting separate turn-on of said MOS transistor and said bipolar transistor.

2. The device of claim 1 wherein said MOS transistor comprises a DMOS transistor.

3. The device of claim 1 wherein said first region is the base and said third region is the emitter of said bipolar transistor.

4. The device of claim 1 wherein said electrical contact means to said first region permitting both turn-on and turn-off of said bipolar transistor.

* * * * *